United States Patent
Knipe et al.

(10) Patent No.: US 7,410,888 B2
(45) Date of Patent: Aug. 12, 2008

(54) METHOD FOR MANUFACTURING STRAINED SILICON

(75) Inventors: Richard L. Knipe, McKinney, TX (US); Grady L. Endsley, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 11/027,512

(22) Filed: Dec. 30, 2004

(65) Prior Publication Data
US 2006/0148214 A1    Jul. 6, 2006

(51) Int. Cl.
*H01L 21/20* (2006.01)
(52) U.S. Cl. .................. 438/478; 257/E21.09
(58) Field of Classification Search ......... 438/478–509; 117/4, 11, 84
See application file for complete search history.

(56) References Cited

U.S. PATENT DOCUMENTS

| | | | | |
|---|---|---|---|---|
| 3,808,674 | A * | 5/1974 | Francombe et al. | 117/94 |
| 4,457,359 | A * | 7/1984 | Holden | 165/80.5 |
| 4,548,658 | A * | 10/1985 | Cook | 117/90 |
| 4,823,607 | A * | 4/1989 | Howe et al. | 73/783 |
| 4,830,984 | A * | 5/1989 | Purdes | 438/492 |
| 5,043,044 | A * | 8/1991 | Hattori et al. | 438/33 |
| 5,562,770 | A * | 10/1996 | Chen et al. | 438/202 |
| 5,893,760 | A * | 4/1999 | Mikata et al. | 438/795 |
| 6,054,387 | A * | 4/2000 | Fukuda | 438/683 |
| 6,156,623 | A * | 12/2000 | Hendrix et al. | 438/457 |
| 6,500,759 | B1 * | 12/2002 | Asakawa | 438/683 |
| 6,884,718 | B2 * | 4/2005 | Basceri | 438/677 |
| 2003/0017626 | A1 * | 1/2003 | Hilt et al. | 438/3 |
| 2004/0018392 | A1 * | 1/2004 | Yoder | 428/698 |
| 2004/0220057 | A1 * | 11/2004 | Ference et al. | 505/100 |
| 2005/0019967 | A1 * | 1/2005 | Ravi | 438/26 |
| 2005/0026332 | A1 * | 2/2005 | Fratti et al. | 438/122 |
| 2005/0035514 | A1 * | 2/2005 | Hillman et al. | 269/21 |

* cited by examiner

*Primary Examiner*—Savitri Mulpuri
(74) *Attorney, Agent, or Firm*—Wade James Brady, III.; Frederick J. Telecky, Jr.

(57) ABSTRACT

In accordance with a particular embodiment of the present invention, a method for manufacturing strained silicon is provided. In one embodiment, the method for manufacturing strained silicon includes inducing a curvature in a silicon wafer, depositing an epitaxial layer of silicon upon an upper surface of the silicon water while the silicon wafer is under the induced curvature, and releasing the silicon wafer from the induced curvature, after depositing the epitaxial layer, such that a strain is induced in the epitaxial layer.

5 Claims, 1 Drawing Sheet

METHOD FOR MANUFACTURING STRAINED SILICON

TECHNICAL FIELD

This invention relates generally to semiconductor manufacturing, and more particularly to a method for manufacturing strained silicon.

BACKGROUND

Silicon is used to manufacture a variety of semiconductors. The speed at which these semiconductors work ultimately depends on the rate at which the transistors in the semiconductors can switch on and off, which in turns depends on the speed at which current can flow through the transistors, and the distance the charge has to travel. One way of reducing this distance is to deform the lattice of the silicon used to manufacture the semiconductors, resulting in a sort of "strained silicon." By stretching the lattice of the silicon, the energies of the orbitals of the silicon in the direction of the tension are lowered, allowing electrons to flow more easily along the aligned orbitals. Similarly, putting the silicon lattice into compression raises the energies of the aligned orbitals, allowing positive charges to flow more easily.

SUMMARY OF THE INVENTION

In accordance with the teachings of the present invention, a method for manufacturing strained silicon is provided. In one embodiment, the method for manufacturing strained silicon includes inducing a curvature in a silicon wafer, depositing an epitaxial layer of silicon upon an upper surface of the silicon wafer while the silicon wafer is under the induced curvature, and releasing the silicon wafer from the induced curvature, after depositing the epitaxial layer, such that a strain is induced in the epitaxial layer.

A technical advantage of some embodiments of the present invention includes the provision of a simple and economical approach to manufacturing strained silicon. Using simple mechanical processes and traditional deposition techniques, particular embodiments may provide an efficient, high-yield method of manufacturing strained silicon.

Another technical advantage of some embodiments of the present invention includes the ability to manufacture strained silicon without introducing an excessive number of defects to the silicon lattice of the epi-layer. Rather than growing the epi-layer in a strained state (either compressive or tensile), which could introduce defects into the lattice of the epi-layer, particular embodiments of the present invention instead mechanically introduce a stress (compressive or tensile) to the epi-layer following deposition of the epi-layer. This allows the silicon to be deposited on the wafer in an optimum state using traditional deposition techniques and may reduce the number of defects formed within the lattice of the epi-layer.

Other technical advantages will be readily apparent to one skilled in the art from the following figures, descriptions, and claims. Moreover, while specific advantages have been enumerated above, various embodiments of the present invention may include some, all, or none of the enumerated technical advantages.

BRIEF DESCRIPTION OF THE DRAWINGS

For a more complete understanding of particular embodiments of the present invention and features and advantages thereof, reference is now made to the following description, taken in conjunction with the accompanying drawings, in which.

DESCRIPTION OF EXAMPLE EMBODIMENTS

Figure 1A:
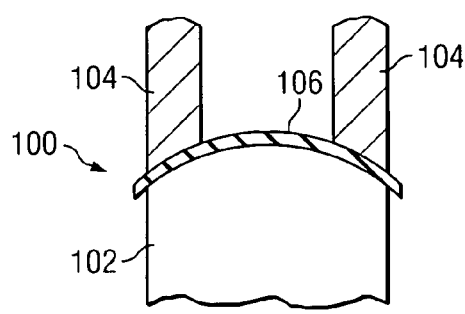
FIG. 1A illustrates a cross-sectional view of a strained silicon manufacturing system in accordance with a particular embodiment of the present invention.
Figure 1B:
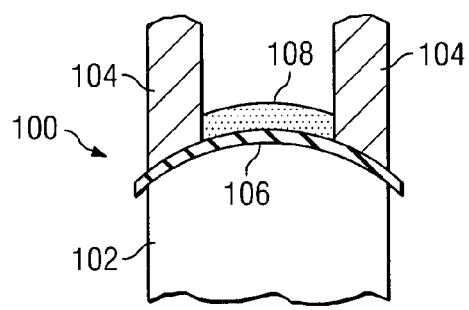
FIG. 1B illustrates later cross-sectional view of the manufacturing system shown in FIG. 1A.
Figure 1C:
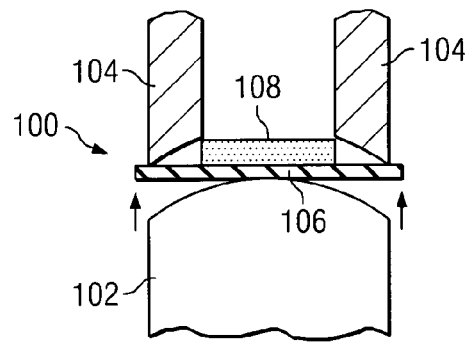
FIG. 1C illustrates an even later cross-sectional view of the manufacturing system shown in FIGS. 1A and 1B.

In accordance with a particular embodiment of the present invention, FIGS. 1A-C illustrate strained silicon manufacturing system 100, which may be used to manufacture strained silicon by introducing a stress into a silicon wafer, depositing an epitaxial layer of silicon upon the silicon wafer, and removing the stress from the silicon wafer such that a strain is induced in the epitaxial layer. By mechanically inducing a strain in the epitaxial layer, or epi-layer, after its deposition, strained silicon manufacturing system 100 offers an economical and efficient way to manufacture strained silicon epi-wafers.

As shown in FIG. 1A-C, manufacturing system 100 comprises platen 102 and vacuum chuck 104, which may be used induce and maintain a stress in silicon wafer 106. As shown in FIGS. 1A-C, platen 102 is a generally cylindrical pedestal having an upper surface that is convex. Of course, other shapes of pedestals may used in accordance with the teachings of the present invention. Nevertheless, when vacuum chuck 104 holds wafer 106 against this convex upper surface, the upper surface of wafer 106 is subjected to a tensile stress. After epi-layer 108 is deposited on the upper surface of wafer 106 and wafer 106 is released by vacuum chuck 104, the tensile stress on wafer 206 is then removed. Removing this stress allows wafer 106 to return to an unstrained state. However, as wafer 106 returns to an unstrained state, the silicon atoms of epi-layer 108 are forced closer together, placing the silicon lattice of epi-layer 108 into uniform compression. A better understanding of this process may be had by referring to FIGS. 1A-C in sequence.

In FIG. 1A, a tensile stress is first induced in the upper surface of wafer 106 by forcing the wafer against the convex surface of platen 102 using vacuum chuck 104. This may be done by placing wafer 106 on platen 102 and holding it in place with a vacuum or over pressure. Once the under side of wafer 106 is flush with platen 102, vacuum chuck 104 may be used to secure wafer 106 in this strained position, alleviating or eliminating further need for the vacuum or over pressure.

With wafer 106 securely held in a tensile state, epi-layer 108 is then deposited upon wafer 106, as shown in FIG. 1B. So deposited, epi-layer 108 may grow in a generally unstrained state. This reduces the number of defects induced in the epi-layer, and allows traditional methods of epi-layer deposition to be used in accordance with the teachings of the present invention.

After epi-layer 108 has been deposited on wafer 106, the strained induced in wafer may be removed by releasing vacuum chuck 104. This is shown in FIG. 1C. As vacuum chuck 104 releases wafer 106 from its tensile state, the wafer is free to return to a unstrained state. In doing so, the atoms in the lattice of epi-layer 108 are forced together as the wafer returns to its original state, placing epi-layer 108 under a uniform compressive strain.

Generally, the amount of the compressive stress induced in the epi-layer is related to the curvature induced in the silicon wafer during the manufacturing process. The relationship between the stress introduced into the silicon, $\sigma$, and the curvature induced into the wafer (as measured from the wafer center to the datum), $\Delta\delta$, may be determined from Stoney's Equation:

$$\sigma = \frac{1}{3}\left(\frac{E}{1-v}\right)_s \frac{t_s^2}{t_f} \frac{\Delta\delta}{r^2}$$

where r is the radius of the wafer, $t_s$ is the thickness of the wafer, $t_f$ is the thickness of the silicon film to be deposited, and $(E/(1-v))_s$ is the stiffness of the wafer.

In particular embodiments of the present invention, one inch of center bow may be induced in an eight-inch wafer having a standard thickness of 0.020 inch. However, other embodiments of the present invention may induce other amounts of desired stress, including that resulting from two to three inches of center bow in a similar wafer. Of course, as would be understood by one of ordinary skill in the art, the amount of curvature that may be induced in the wafer will depend on the thickness of the wafer. Generally, thicker wafers may be subjected to lesser amounts of curvature before an excessive amount of defects are induced in the wafer, while thinner wafers may be subjected to greater amounts of curvature before excessive defects develop. Furthermore, although a wafer may be bent without damaging the wafer itself, another consideration is the number of defects that are introduced into the epi-layer when the wafer is allowed to return to an unstrained state. Generally, greater levels of strain (compression or tension) induced in the epi-layer result in faster electron transport. However, greater levels of strain may result in defects being introduced to the lattice of the epi-layer. One of ordinary skill in the art should be able to recognize the tradeoffs between greater levels of strain and greater numbers of defects induced in the epi-layer, and select a suitable level of strain to induce in the silicon.

Although FIGS. 1A-C illustrate a system and method for manufacturing strained silicon having a compressive strain bias, other embodiments of the present invention could also be used to produce a tensile strain bias in the resulting strained silicon. An example of such an embodiment is illustrated in FIGS. 2A-C.

Figure 2A:
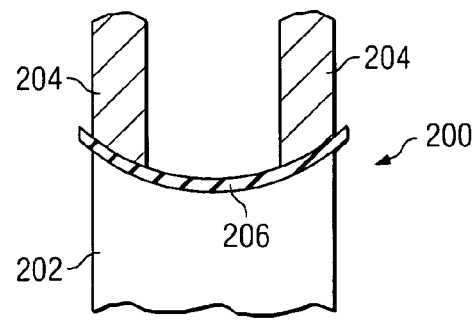
FIG. 2A illustrates a cross-sectional view of another strained silicon manufacturing system in accordance with a particular embodiment of the present invention.
Figure 2B:
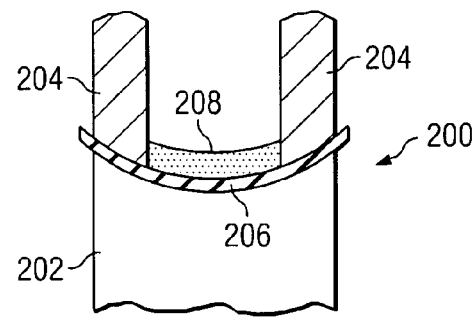
FIG. 2B illustrates a later cross-sectional view of the manufacturing system shown in FIG. 2A.
Figure 2C:
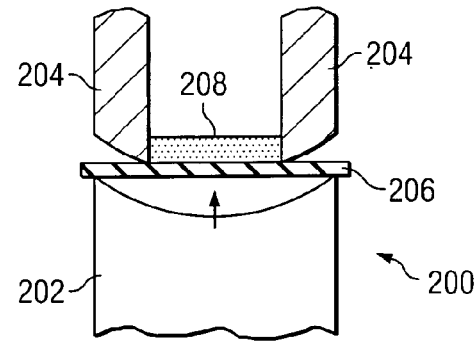
FIG. 2C illustrates an even later cross-sectional view of the manufacturing system shown in FIGS. 2A and 2B.

FIGS. 2A-C illustrate strained silicon manufacturing system 200. Similar to system 100 shown, in FIGS. 1A-C, manufacturing system 200 comprises platen 202 and vacuum chuck 204. Unlike platen 102 illustrated in FIGS. 1A-C, platen 202 is a generally cylindrical pedestal having an upper surface that is concave (as opposed to the convex upper surface of platen 102), although other pedestal shapes may used in accordance with the teachings of the present invention. When vacuum chuck 204 holds wafer 206 against this concave upper surface, the upper surface of wafer 206 is subjected to a compressive stress. After epi-layer 208 is deposited on the upper surface of wafer 206 and wafer 206 is released by vacuum chuck 204, the compressive stress on wafer 206 is removed. Removing this compressive stress allows wafer 206 to return to its natural, unstrained state. However, in doing so, epi-layer 208 is put into a tensile state, straining the silicon lattice of the epi-layer. A better understanding of this process is available by looking at FIGS. 2A-C in sequence.

As shown in FIG. 2A, a compressive stress is first induced in wafer 206. This is accomplished by forcing wafer 206 against the concave surface of platen 202 using vacuum chuck 204. In order to ensure that wafer 206 is held flush against platen 202, particular embodiments of the present invention employ a vacuum on the under side (platen side) of wafer 206 to hold the wafer in place against the platen. Similarly, an over pressure on the upper side (chuck side) of wafer 206 could also be used to hold the wafer in place against the platen. Once the under side of wafer 206 is flush with platen 202, vacuum chuck 204 may be used to secure wafer 206 in this strained position, alleviating or eliminating further need for the vacuum or over pressure.

With wafer 206 securely held in a compressive state, epi-layer 208 is then deposited upon wafer 206, as shown in FIG. 2B. So deposited, epi-layer 208 may grow in a generally unstrained state. This reduces the number of defects induced in the epi-layer, and allows traditional methods of epi-layer deposition to be used in accordance with the teachings of the present invention.

Once epi-layer 208 has been deposited on wafer 206, the wafer is then released by vacuum chuck 204, as shown in FIG. 2C. Releasing wafer 206 allows the wafer to return to its natural, unstrained state. As wafer 206 returns to an unstrained state, the compressive strain induced in the wafer is at least partially transferred to epi-layer 208 in the form of a tensile strain. Similar to an epi-layer under a compressive strain, this tensile strain also helps increase the rate of electron transport through the lattice of the epi-layer.

Of course, while specific structures and equipment have been described in the foregoing description, it should be understood that other structures may be used to induce a stress or curvature in a silicon wafer in accordance with the teachings of the present invention. With the benefit of the present disclosure, one of ordinary skill art should be able to select a suitable apparatus for inducing such a stress or curvatuve.

Figure 3:
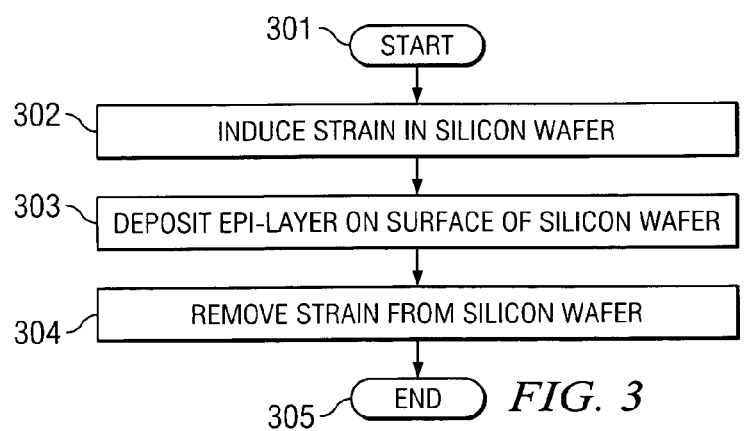
FIG. 3 illustrates a flowchart of a method of manufacturing strained silicon in accordance with a particular embodiment of the present invention.

With that understanding, a flowchart of a method for manufacturing strained silicon in accordance with the teachings of the present invention is illustrated in FIG. 3. As shown in FIG. 3, flowchart 300 begins in block 301. At block 302, a strain is induced in a silicon wafer. As discussed above this may be accomplished by inducing a curvature in the wafer using a platen and vacuum chuck or other suitable techniques. After the wafer is secured in a strained positioned, an epi-layer of silicon is deposited on the upper surface of the wafer in block 303. In this stage, the epi-layer is deposited in a generally unstrained state. After the deposition of the epi-layer, however, the wafer is released in block 304. Without anything maintaining the curvature of the wafer, the wafer may return to its natural, unstrained state. As the strain is removed from the wafer, an opposite strain is induced in the silicon lattice of the epi-layer on the upper surface of the wafer. This strain in the epi-layer allows for faster electron transport through the lattice of the epi-layer. After this strain has been induced in the epi-layer, the process terminates in block 305.

By mechanically inducing a strain in a silicon wafer prior to the deposition of an epi-layer of silicon, particular embodiments of the present invention may offer numerous technical advantages. For example, particular embodiments of the present invention offer an simple and economical approach to manufacturing strained silicon. Using simple mechanical processes and traditional deposition techniques, particular embodiments may provide an efficient method of manufacturing strained silicon.

Particular embodiments of the present invention may also offer the ability to manufacture strained silicon without introducing an excessive number of defects to the silicon lattice of the epi-layer. Rather than growing the epi-layer in a strained state (either compressive or tensile), which could introduce defects into the lattice of the epi-layer, particular embodiments of the present invention instead mechanically introduce a stress (compressive or tensile) to the epi-layer following deposition of the epi-layer. This allows the silicon to be deposited on the wafer in an optimum state using traditional deposition techniques and may reduce the number of defects formed within the lattice of the epi-layer.

Although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A method for manufacturing strained silicon, comprising:
   bending a silicon wafer against a curved surface of a platen such that a curvature is induced in the silicon wafer;
   depositing an epitaxial layer of silicon upon an upper surface of the silicon layer while the silicon wafer is under the induced curvature, wherein the curvature is induced by bending the silicon wafer between the curved surface of the platen and a vacuum chuck; and
   releasing the silicon wafer from the induced curvature, after depositing the epitaxial layer, such that a strain is induced in the epitaxial layer wherein the strain induced the epitaxial layer is related to the curvature induced in the silicon wafer by Stoney's Equation.

2. The method of claim 1, wherein the strain is compressive.

3. The method of claim 1, wherein the strain is tensile.

4. The method of claim 1, wherein the platen has a convex upper surface.

5. The method of claim 1, wherein the platen has a concave upper surface.

* * * * *